US011139810B2

(12) United States Patent
Pham et al.

(10) Patent No.: US 11,139,810 B2
(45) Date of Patent: Oct. 5, 2021

(54) OVERCURRENT PROTECTION FOR POWER TRANSISTORS

(71) Applicant: Cree, Inc., Durham, NC (US)

(72) Inventors: Cam Pham, Unterschleissheim (DE); Alejandro Esquivel Rodriguez, Unterschleissheim (DE)

(73) Assignee: Cree, Inc., Durham, NC (US)

( * ) Notice: Subject to any disclaimer, the term of this patent is extended or adjusted under 35 U.S.C. 154(b) by 118 days.

(21) Appl. No.: 16/524,726

(22) Filed: Jul. 29, 2019

(65) Prior Publication Data

US 2021/0036696 A1 Feb. 4, 2021

(51) Int. Cl.
*H03K 17/082* (2006.01)

(52) U.S. Cl.
CPC ..... *H03K 17/0822* (2013.01); *H03K 17/0826* (2013.01); *H03K 2217/0027* (2013.01)

(58) Field of Classification Search
CPC .................................................. H03K 17/082
See application file for complete search history.

(56) References Cited

U.S. PATENT DOCUMENTS

| 4,945,445 | A | * | 7/1990 | Schmerda | .......... | H03K 17/0822 |
| | | | | | | 361/101 |
| 5,191,297 | A | * | 3/1993 | Penman | ................ | H03F 1/3217 |
| | | | | | | 330/146 |
| 5,495,154 | A | * | 2/1996 | Carobolante | ............. | H02P 6/28 |
| | | | | | | 318/293 |
| 5,926,012 | A | | 7/1999 | Takizawa et al. | | |
| 6,127,746 | A | * | 10/2000 | Clemente | ............. | H03K 17/168 |
| | | | | | | 307/131 |
| 9,991,880 | B2 | * | 6/2018 | Xu | .......................... | H02M 1/08 |
| 2015/0061643 | A1 | * | 3/2015 | Aerts | ................. | G01R 19/0092 |
| | | | | | | 324/123 R |
| 2016/0065087 | A1 | | 3/2016 | Nagaoka | | |
| 2017/0110874 | A1 | * | 4/2017 | van Dijk | ................ | H02H 3/087 |

FOREIGN PATENT DOCUMENTS

| EP | 1191692 A1 | 3/2002 |
| EP | 2495875 A1 | 9/2012 |

OTHER PUBLICATIONS

Author Unknown, "CoolSiC™ 1200 V SiC MOSFET Application Note," AN2017-46, Revision 1.01, Jul. 1, 2018, Infineon Technologies AG, 27 pages.
International Search Report and Written Opinion for International Patent Application No. PCT/US2020/043196, dated Oct. 13, 2020, 14 pages.

* cited by examiner

*Primary Examiner* — Patricia T Nguyen
(74) *Attorney, Agent, or Firm* — Withrow & Terranova, PLLC

(57) ABSTRACT

Support circuitry for a power transistor includes a feedback switching element and switching control circuitry. The feedback switching element is coupled between a Kelvin connection node and a second power switching node. The switching control circuitry is configured to cause the feedback switching element to couple the Kelvin connection node to the second power switching node after the power transistor is switched from a blocking mode of operation to a conduction mode of operation and cause the feedback switching element to isolate the Kelvin connection node from the second power switching node before the power transistor is switched from the conduction mode of operation to the blocking mode of operation.

22 Claims, 8 Drawing Sheets

OVERCURRENT PROTECTION FOR POWER TRANSISTORS

FIELD OF THE DISCLOSURE

The present disclosure relates to the protection of power transistors from overcurrent events.

BACKGROUND

Power transistors such as metal-oxide-semiconductor field-effect transistors (MOSFETs) and insulated gate bipolar transistors (IGBTs) are used for selectively delivering current to and from a load in a power electronics system. In some situations, the load may cause a short circuit across a power transistor or otherwise cause a very high current to run through the power transistor. Absent overcurrent protection mechanisms, the power transistor will fail after an overcurrent withstand time.

State of the art mechanisms for overcurrent protection have focused on providing overcurrent protection circuitry that is integrated into the semiconductor die of the power transistor. While such overcurrent protection circuitry may be effective in increasing the overcurrent withstand time of the power transistor, it also takes up active area on the semiconductor die. Accordingly, there is less active area to devote to the current carrying portion of the power transistor, and thus a current carrying capacity of the power transistor will be reduced unless a total area of the semiconductor die is increased. Often, power transistors for power electronics will be provided using a wide bandgap semiconductor material system such as gallium nitride or silicon carbide. These materials are often valuable, and thus increasing the area of the semiconductor die is generally undesirable.

In light of the above, there is a present need for improved systems and methods for protecting power transistors from overcurrent events.

SUMMARY

In one embodiment, support circuitry for a power transistor includes a feedback switching element and switching control circuitry. The power transistor includes a control node, a Kelvin connection node, a first power switching node, a second power switching node, and a semiconductor structure between the nodes such that a resistance between the first power switching node and the second power switching node is based on a control signal provided between the control node and the Kelvin connection node. The feedback switching element is coupled between the Kelvin connection node and the second power switching node. The switching control circuitry is configured to cause the feedback switching element to couple the Kelvin connection node to the second power switching node after the power transistor is switched from a blocking mode of operation to a conduction mode of operation and cause the feedback switching element to isolate the Kelvin connection node from the second power switching node before the power transistor is switched from the conduction mode of operation to the blocking mode of operation. By coupling the Kelvin connection node to the second power switching node after the power transistor is switched from the blocking mode of operation to the conduction mode of operation, an inherent feedback mechanism is introduced to protect the power transistor against overcurrent events. By isolating the Kelvin connection node from the second power switching node before the power transistor is switched from the conduction mode of operation to the blocking mode of operation, the switching speed of the power transistor is maintained.

In one embodiment, a sense resistor is coupled between the Kelvin connection node and the feedback switching element. Sense circuitry is configured to measure a voltage across the sense resistor to detect overcurrent events. Since the feedback switching element, when closed, provides a current path parallel to a power loop of the power transistor but with much lower current, overcurrent events may be easily detected in a fast manner without requiring resistive elements that are tolerant of extremely high voltages and/or currents and power dissipation.

In one embodiment, a first overcurrent protection switching element is coupled in series with an overcurrent protection diode (or a predetermined voltage) between the sense resistor and the control node. A second overcurrent protection switching element is coupled between the control node and a predetermined voltage. On detection of an overcurrent event when the power transistor is operating in a first quadrant mode of operation, the first overcurrent protection switch is closed to clamp a voltage at the control node and partially or fully turn off the power transistor. On detection of an overcurrent event when the power transistor is operating in a third quadrant mode of operation, the second overcurrent protection switch is closed to provide the predetermined voltage at the control node and thus partially or fully turn on the power transistor. In either case, the overcurrent withstand time of the power transistor is significantly increased, sometimes indefinitely.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
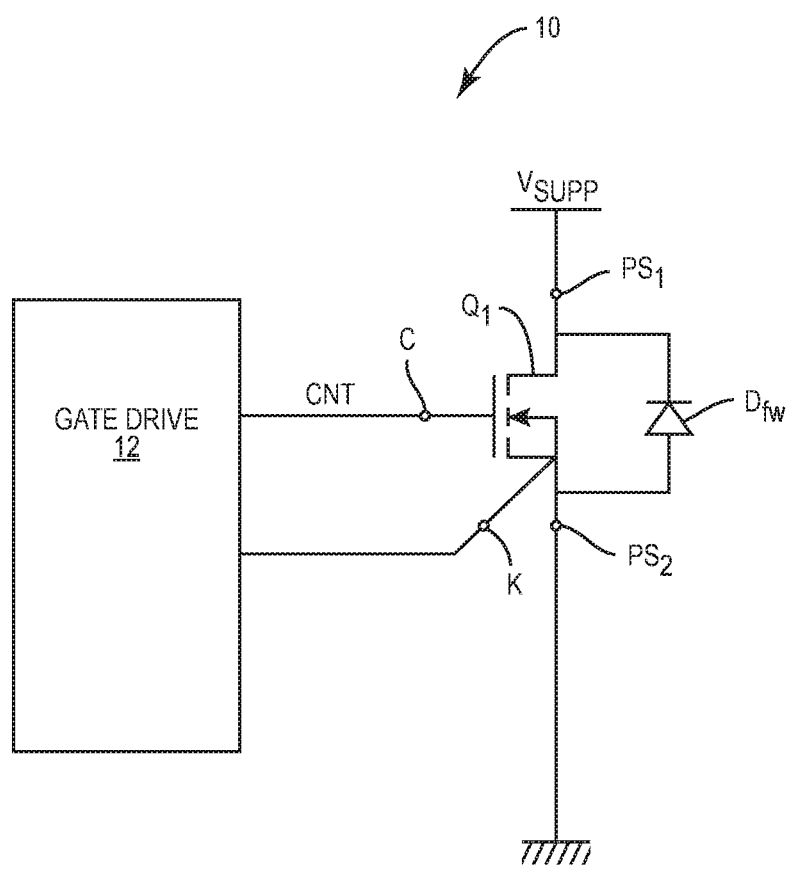
FIG. 1 is a schematic diagram of a conventional gate driver system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a conventional gate drive system 10. The conventional gate drive system 10 includes gate drive circuitry 12 configured to drive a power transistor $Q_1$ to selectively deliver power to a load (not shown). The power transistor $Q_1$ is shown as a metal-oxide-semiconductor field-effect transistor (MOSFET) including a control node C, a first power switching node $PS_1$, a second power switching node $PS_2$, and a Kelvin connection node K. The MOSFET includes a semiconductor structure between the control node C, the first power switching node $PS_1$, the second power switching node $PS_2$, and the Kelvin connection node K. The semiconductor structure is configured such that a control signal CNT provided between the control node C and the Kelvin connection node K varies a resistance between the first power switching node $PS_1$ and the second power switching node $PS_2$. The control node C is coupled to a gate region in the semiconductor structure, the first power switching node $PS_1$ is coupled to a drain region in the semiconductor structure, and the second power switching node $PS_2$ and the Kelvin connection node K are coupled to a source region in the semiconductor structure. By varying a resistance between the first power switching node $PS_1$ and the second power switching node $PS_2$, a current through the power transistor $Q_1$ and a voltage across the power transistor $Q_1$ may similarly be varied to selectively deliver power to a load. Those skilled in the art will readily appreciate the structure and functionality of the power transistor $Q_1$ and thus it is not discussed in detail herein.

In some embodiments, a freewheeling diode $D_{fw}$ is coupled in anti-parallel with the power transistor $Q_1$ for bidirectional current conduction. The freewheeling diode $D_{fw}$ may be external to the power transistor $Q_1$ or may be internal to the power transistor $Q_1$ (i.e., an internal body diode).

As discussed above, both the second power switching node $PS_2$ and the Kelvin connection node K are coupled to a source region in the semiconductor structure of the power transistor $Q_1$. Providing a separate connection to the source region effectively isolates a control loop (between the control node CNT and the Kelvin connection node K) of the power transistor $Q_1$ from a power switching loop (between the first power switching node $PS_1$ and the second power switching node $PS_2$). In particular, doing so reduces the impact that a stray inductance of the connection to the second power switching node $PS_2$ may otherwise have on the control loop to avoid feedback between the power loop and the control loop.

The control signal CNT may switch the power transistor $Q_1$ between a blocking mode of operation and a conduction mode of operation. In the blocking mode of operation, the power transistor $Q_1$ is turned off such that minimal current flows from the first power switching node $PS_1$ and the second power switching node $PS_2$. Current may still flow from the second power switching node $PS_2$ to the first power switching node $PS_1$ through the freewheeling diode $D_{fw}$. In the conduction mode of operation, the power transistor $Q_1$ may be turned on such that current flows between the first power switching node $PS_1$ and the second power switching node $PS_2$. The conduction mode of operation may include a first quadrant mode of operation in which current flows from the first power switching node $PS_1$ to the second power switching node $PS_2$ and a third quadrant mode of operation in which current flows in the opposite direction from the second power switching node $PS_2$ to the first power switching node $PS_1$. The control signal CNT may thus be grounded or provided as a negative voltage (with reference to the supply voltage $V_{SUPP}$) to switch the power transistor $Q_1$ into the blocking mode of operation and as a positive voltage above a threshold voltage of the power transistor $Q_1$ (e.g., 15V) to switch the power transistor $Q_1$ into a conduction mode of operation. However, these values are merely exemplary and will be different based on the specifications of the power transistor $Q_1$ (e.g., enhancement mode vs. depletion mode, threshold voltage, etc.)

While the conventional gate drive system 10 may effectively drive the power transistor $Q_1$ to selectively deliver power to a load, it does not provide any protection for the power transistor $Q_1$ against overcurrent events. Accordingly, should an overcurrent event occur, the power transistor $Q_1$ will fail after an overcurrent withstand time, which may be quite short, especially if the power transistor $Q_1$ has a small die area, which is often the case with wide bandgap semiconductor devices.

Figure 2:
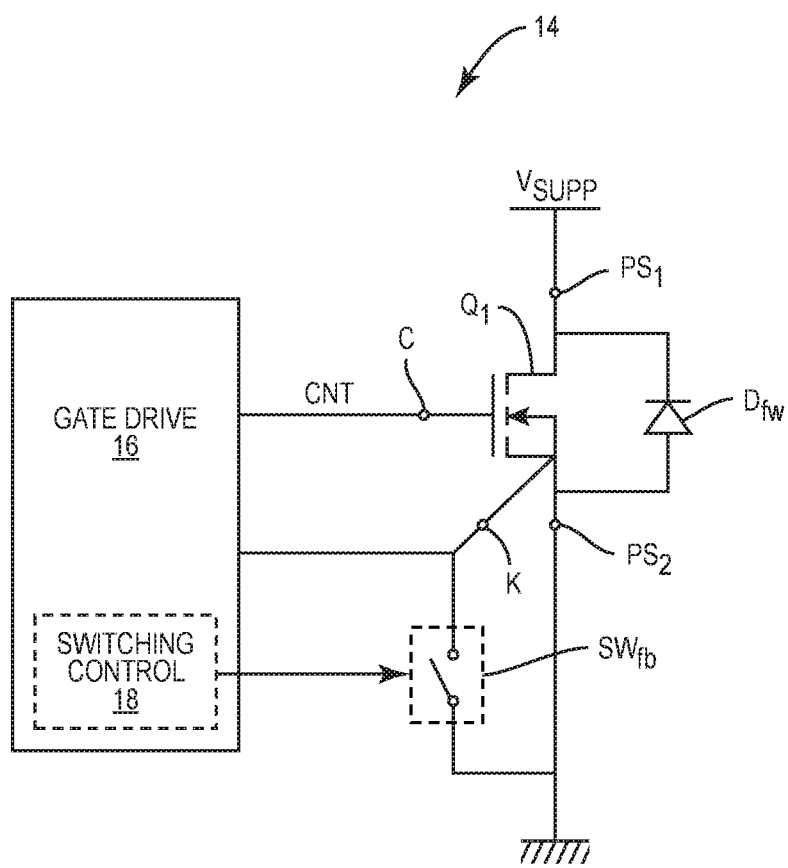
FIG. 2 is a schematic diagram of a gate driver system according to one embodiment of the present disclosure.

FIG. 2 shows a gate drive system 14 according to one embodiment of the present disclosure. The gate drive system 14 includes gate drive circuitry 16 configured to drive a power transistor $Q_1$ to selectively deliver power to a load (not shown). The gate drive system 14 shown in FIG. 2 is substantially similar to that shown in FIG. 1, but further includes a feedback switching element $SW_{fb}$ coupled between the Kelvin connection node K and the second power switching node $PS_2$. Further, the gate drive system 14 includes switching control circuitry 18, which is shown included in the gate drive circuitry 16 but could also be external to the gate drive circuitry 16. The switching control circuitry 18 is configured to selectively couple the Kelvin connection node K to the second power switching node $PS_2$. In particular, after the control signal CNT is provided to switch the power transistor $Q_1$ from the blocking mode of operation to the conduction mode of operation, the switching control circuitry 18 is configured to couple the Kelvin connection node to the second power switching node $PS_2$, and before the control signal CNT is provided to switch the power transistor $Q_1$ from the conduction mode of operation to the blocking mode of operation, the switching control circuitry 18 is configured to isolate the Kelvin connection node K from the second power switching node $PS_2$.

When the Kelvin connection node K is isolated from the second power switching node $PS_2$, the voltage between the control node C and the Kelvin connection node K $V_{c\text{-}k}$ is provided according to Equation (1):

$$V_{c\text{-}k} = V_{cnt} \quad (1)$$

where $V_{cnt}$ is the voltage provided by the gate drive circuitry 16 at the control node C. When the Kelvin connection node K is coupled to the second power switching node $PS_2$, the voltage between the control node C and the Kelvin connection node K $V_{c\text{-}k}$ is provided according to Equation (2):

$$V_{c\text{-}k} = V_{cnt} \pm V_{ls} \cdot di/dt \quad (2)$$

where $V_{ls}$ is a voltage across the stray inductance of the connection from the second power switching node $PS_2$ and the power transistor $Q_1$. Notably, Equation (2) is essentially the same voltage response that occurs when a power transistor without a Kelvin connection is used. The inductance of the connection from the second power switching node $PS_2$ to the power transistor $Q_1$ is directly in the power switching path of the power transistor $Q_1$, and thus a significant voltage is formed across this inductance. This provides a feedback mechanism between the power loop and the control loop.

In the first quadrant mode of operation, the voltage formed across the stray inductance is positive and reduces the voltage between the control node C and the Kelvin connection node K $V_{c\text{-}k}$ such that the power transistor $Q_1$ is partially turned off. During normal operation of the power transistor $Q_1$, the voltage across the stray inductance is minimal and thus does not interfere with the operation thereof. During an overcurrent event, a voltage across the stray inductance is much larger and thus will significantly reduce the voltage between the control node C and the Kelvin connection node K $V_{c\text{-}k}$ such that an overcurrent withstand time of the power transistor $Q_1$ is significantly extended. In the third quadrant mode of operation, the voltage formed across the stray inductance is negative and thus increases the voltage between the control node C and the Kelvin connection node K $V_{c\text{-}k}$ such that the power transistor $Q_1$ is turned partially on or kept on. This will cause current to flow not only through the freewheeling diode $D_{fw}$ but also through the channel of the power transistor $Q_1$. This increases the current carrying capacity of the power transistor $Q_1$ in the reverse direction and thus increases the overcurrent withstand time. In short, during an overcurrent event during the first quadrant mode of operation, the feedback switching element $SW_{fb}$, when operated as described above, reduces the amount of current flowing through the power transistor $Q_1$ and thus increases the overcurrent withstand time thereof. During an overcurrent event in the third quadrant of operation, the feedback switching element $SW_{fb}$, when operated as described above, increases the $I^2t$ or amperes squared per second of the freewheeling diode $D_{fw}$ (i.e., the current carrying capacity) and thus increases the overcurrent withstand time thereof.

The above benefits of increasing the overcurrent withstand time of the power transistor $Q_1$ are achieved without sacrificing the performance of the power transistor $Q_1$ with respect to switching time. This is because the switching control circuitry 18 is configured to isolate the Kelvin connection node K from the second power switching node $PS_2$ after the control signal CNT is provided to switch the power transistor $Q_1$ from the blocking mode of operation to the conduction mode of operation and before the control signal CNT is provided to switch the power transistor $Q_1$ from the conduction mode of operation to the blocking mode of operation. Accordingly, the feedback discussed above provided by the stray inductance between the second power switching node $PS_2$ and the power transistor $Q_1$ does not affect the control loop during turn on and turn off of the power transistor $Q_1$, and therefore does not reduce a switching time thereof. Accordingly, the gate drive system 14 provides overcurrent protection while maintaining the switching performance of the power transistor $Q_1$.

The feedback switching element $SW_{fb}$ may be any suitable switching element such as a MOSFET, IGBT, junction field-effect transistor (JFET), or the like. The switching control circuitry 18 may be any suitable circuitry for accomplishing the tasks discussed herein, and as discussed above may be a part of the gate drive circuitry 16 or separate from the gate drive circuitry 16.

Figure 3:
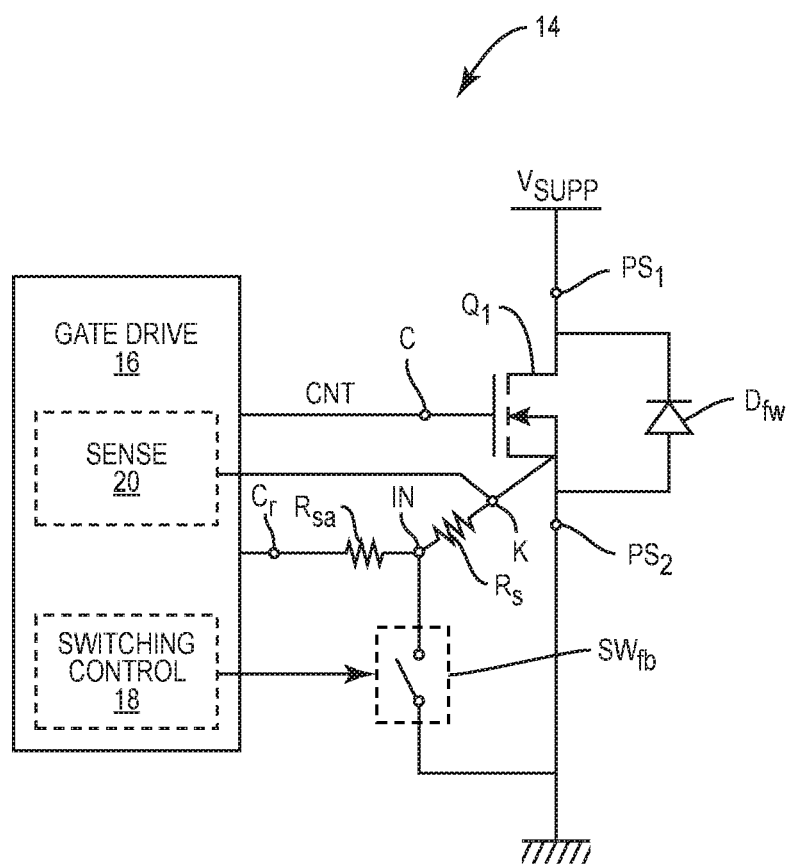
FIG. 3 is a schematic diagram of a gate driver system according to one embodiment of the present disclosure.

FIG. 3 shows the gate drive system 14 according to an additional embodiment of the present disclosure. The gate drive system 14 shown in FIG. 3 is substantially similar to that shown in FIG. 2, but further includes a sense resistor $R_s$ coupled between the Kelvin connection node K and an intermediate node IN, an additional sense resistor $R_{sa}$ coupled between the intermediate node IN and a control return node $C_r$, and sense circuitry 20 coupled to the Kelvin connection node K. The sense circuitry 20 is configured to measure a voltage across the sense resistor $R_s$ and the additional sense resistor $R_{sa}$ to detect an overcurrent event. As discussed above, the feedback switching element $SW_{fb}$ is closed when the power transistor $Q_1$ is operating in a conduction mode of operation. Accordingly, a current proportional to the current in the power loop of the power transistor $Q_1$ will flow through the sense resistor $R_s$ and create a sense voltage across the sense resistor $R_s$. Notably, this current will be much smaller than the one flowing through the power loop. Accordingly, the sense resistor $R_s$ does not have to be extremely tolerant of high voltages and/or currents or power dissipation. The additional sense resistor $R_{sa}$ is provided to ensure that current does not flow from intermediate node IN to the gate drive circuitry 16 and vice versa. Accordingly, a resistance of the additional sense resistor $R_{sa}$ may be significantly higher than that of the sense resistor (e.g., one, two, three or more orders of magnitude higher). Conventionally, measuring a current through the power loop has required a resistive element in the power loop (e.g., coupled to the second power switching node $PS_2$). Due to the high currents that flow in the power loop, such a resistive element has to be extremely tolerant to high power, and thus is expensive or impractical to implement. The feedback switching element $SW_{fb}$, when operated as described above, provides a parallel current path with a current that is proportional to the power loop without being nearly as high. Accordingly, current in the power path can be measured using normal resistors. This enables the fast detection of overcurrent events, thus enabling further protection mechanisms to be implemented. The sense circuitry 20 may be configured to detect an overcurrent event based on a magnitude of a voltage across the sense resistor $R_s$. For example, when a voltage across the sense resistor $R_s$ is above a threshold value, the sense circuitry 20 may detect an overcurrent event.

Figure 4:
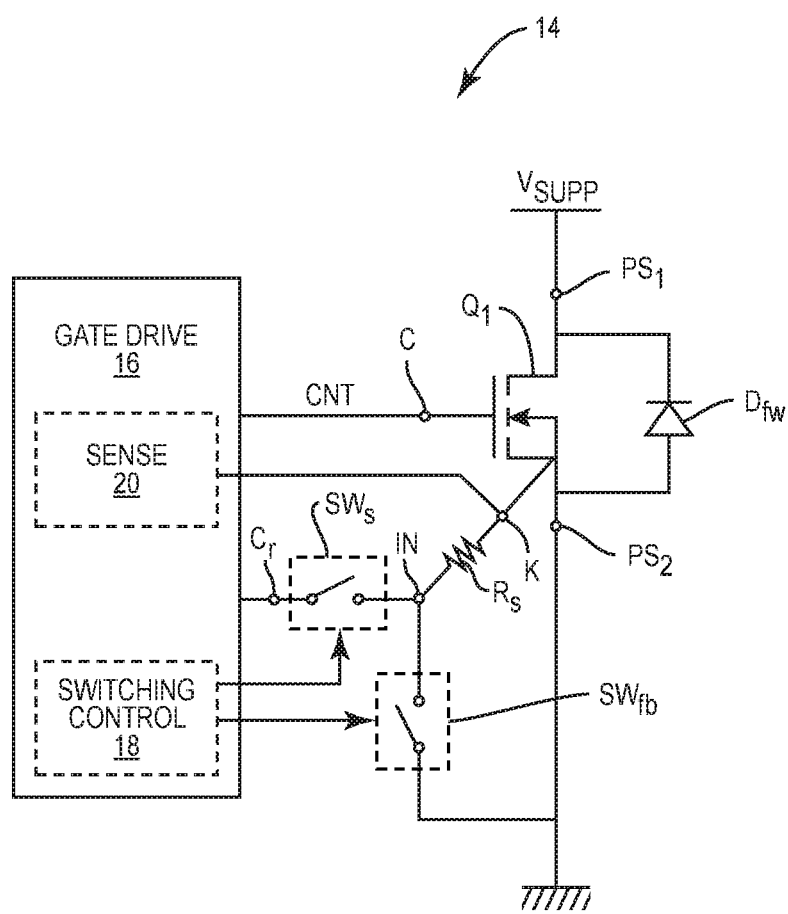
FIG. 4 is a schematic diagram of a gate driver system according to one embodiment of the present disclosure.

While the sense circuitry 20 is shown included in the gate drive circuitry 16, the sense circuitry 20 may also be external to the gate drive circuitry 16 without departing from the principles described herein. As discussed above, the purpose of the additional sense resistor $R_{sa}$ is to prevent current from flowing from the gate drive circuitry 16 into the power loop. Accordingly, the functionality of the additional sense resistor $R_{sa}$ could also be accomplished by a sense switching element $SW_s$ as shown in FIG. 4. The switching control circuitry 18 may operate the sense switching element $SW_s$ in a complementary fashion to the feedback switching element $SW_{fb}$ such that when the feedback switching element $SW_{fb}$ is closed, the sense switching element $SW_s$ is open, and vice versa.

Figure 5:
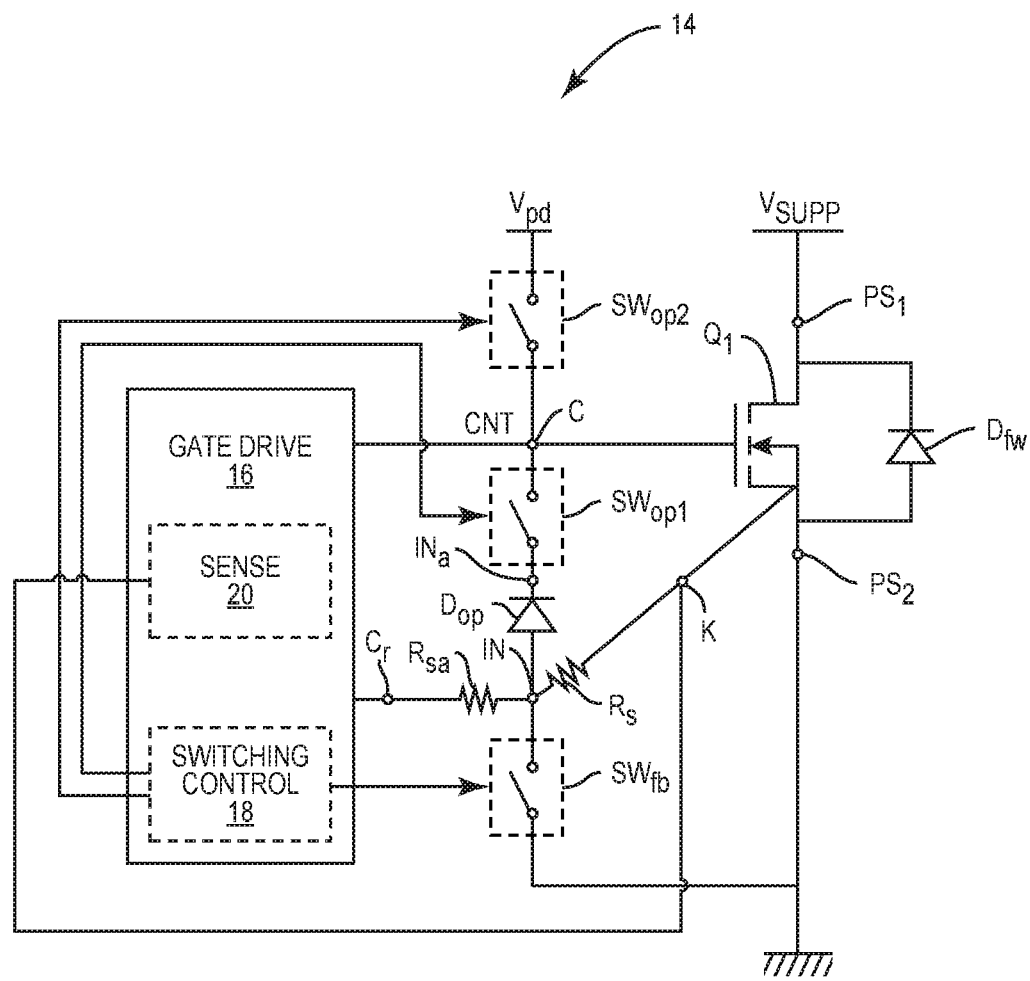
FIG. 5 is a schematic diagram of a gate driver system according to one embodiment of the present disclosure.

The sense circuitry 20 shown in FIGS. 4 and 5 is merely exemplary. In general, the present disclosure proposes providing a parallel current path to the power loop with a much smaller current than the power loop and measuring the current in the parallel current path to detect overcurrent events. This may be accomplished in many different ways, all of which are contemplated herein. On detection of an overcurrent event, external circuitry may be provided and operated to protect the power transistor. In other embodiments, the gate drive circuitry 16 may change the control signal CNT based on the detection of an overcurrent event. For example, on detection of an overcurrent event when the power transistor $Q_1$ is operating in the first quadrant mode of operation, the control signal CNT may be provided to cause the power transistor $Q_1$ to partially or fully enter a blocking mode of operation. Accordingly, the current through the power transistor $Q_1$ will be significantly reduced or eliminated, thereby extending the overcurrent withstand time of the power transistor $Q_1$, sometimes indefinitely. On detection of an overcurrent event when the power transistor $Q_1$ is operating in the third quadrant mode of operation, the control signal CNT may be provided to cause the power transistor $Q_1$ to enter a conduction mode of operation. This may enable the reverse current through the freewheeling diode $D_{fw}$ to be partially or entirely shared by the power transistor $Q_1$, thereby increasing current carrying capacity in the reverse direction and reducing power dissipation such that the overcurrent withstand time of the power transistor $Q_1$ and the freewheeling diode $D_{fw}$ (and other paralleled devices that are not shown) is increased, sometimes indefinitely.

FIG. 5 shows the gate drive system 14 according to an additional embodiment of the present disclosure. The gate drive system 14 shown in FIG. 5 is substantially similar to that shown in FIG. 3, but further includes a first overcurrent protection switching element $SW_{op1}$, a second overcurrent protection switching element $SW_{op2}$, and an overcurrent protection diode $D_{op}$. The overcurrent protection diode $D_{op}$ is coupled between the intermediate node IN and an additional intermediate node $IN_a$. The first overcurrent protection switching element $SW_{op1}$ is coupled between the additional intermediate node $IN_a$ and the control node CNT. The second overcurrent protection switching element $SW_{op2}$ is coupled between the control node CNT and a predetermined voltage $V_{pd}$. The switching control circuitry 18 is coupled to the first overcurrent protection switching element $SW_{op1}$ and the second overcurrent protection switching element $SW_{op2}$.

In operation, when an overcurrent event is detected by the sense circuitry 20 and the power transistor $Q_1$ is operating in the first quadrant mode of operation, the switching control circuitry 18 may cause the first overcurrent protection switching element $SW_{op1}$ to close and the second overcurrent protection switching element $SW_{op2}$ to open, thus coupling the intermediate node IN to the control node CNT via the overcurrent protection diode $D_{op}$. This effectively clamps the voltage between the control node C and the Kelvin connection node K $V_{c-k}$ and partially or fully turns off the power transistor $Q_1$. This significantly reduces the amount of current flowing through the power transistor $Q_1$ and thus further increases the overcurrent withstand time, sometimes indefinitely.

When an overcurrent event is detected by the sense circuitry 20 and the power transistor $Q_1$ is operating in the third quadrant mode of operation, the switching control circuitry 18 may cause the first overcurrent protection switching element $SW_{op1}$ to open and the second overcurrent protection switching element $SW_{op2}$ to close, thus coupling the control node CNT to the predetermined voltage $V_{pd}$. The predetermined voltage $V_{pd}$ may be configured to ensure that the power transistor $Q_1$ is in a conduction mode of operation such that current can be conducted through a channel thereof. Accordingly, a current from the second power switching node $PS_2$ to the first power switching node $PS_1$ can flow through both the freewheeling diode $D_{fw}$ and the channel of the power transistor $Q_1$. This effectively increases the current carrying capacity of the power transistor $Q_1$ and the freewheeling diode $D_{fw}$ from the second power switching node $PS_2$ to the first power switching node $PS_1$, reducing power dissipation and thus extending the overcurrent withstand time, sometimes indefinitely.

Figure 6:
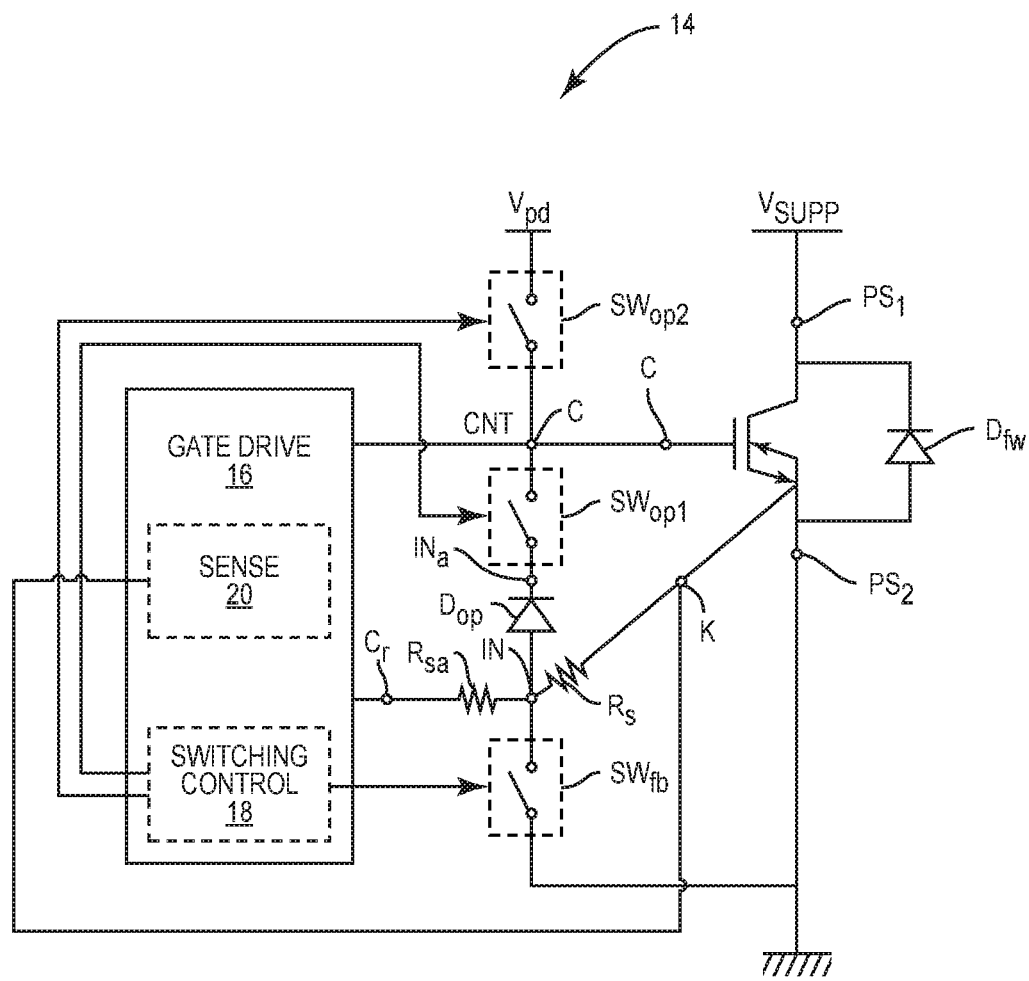
FIG. 6 is a schematic diagram of a gate driver system according to one embodiment of the present disclosure.

While the principles of the present disclosure are discussed above with respect to a MOSFET, the power transistor $Q_1$ may be any suitable type of power transistor such as an insulated gate bipolar transistor (IGBT). Specifically, the power transistor $Q_1$ may be a reverse conducting IGBT (RC-IGBT). FIG. 6 shows the gate drive system 14 wherein the power transistor $Q_1$ is an IGBT. The gate drive system 10 is substantially similar to that shown in FIG. 5. While not shown, the power transistor $Q_1$ includes a semiconductor structure between the control node, the first power switching node $PS_1$, the second power switching node $PS_2$, and the Kelvin connection node K such that a control signal CNT provided between the control node C and the Kelvin connection node K varies a resistance between the first power switching node $PS_1$ and the second power switching node $PS_2$. The control node C is coupled to a gate region in the semiconductor structure, the first power switching node $PS_1$ is coupled to a collector region and a cathode region in the semiconductor structure, and the second power switching node $PS_2$ and the Kelvin connection node are coupled to an emitter region and an anode region in the semiconductor structure.

Figure 7:
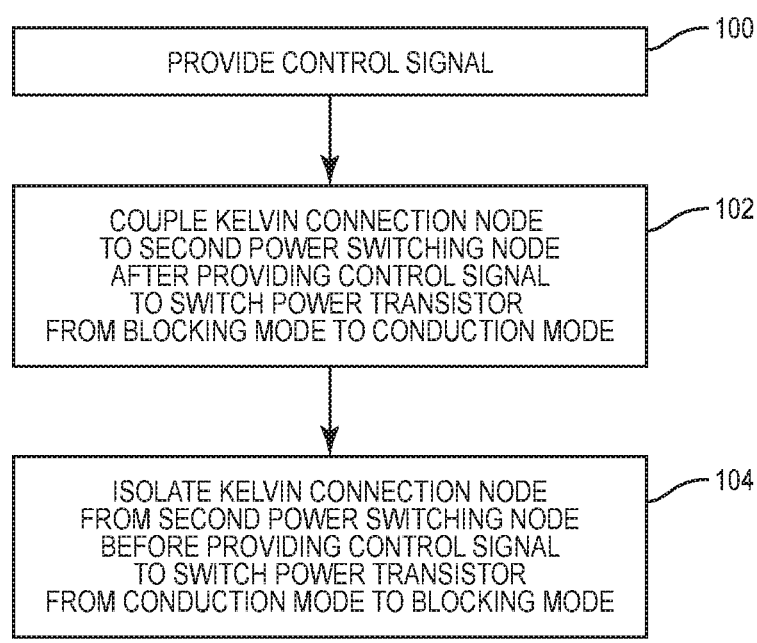
FIG. 7 is a flow diagram illustrating a method for protecting a power transistor from an overcurrent event according to one embodiment of the present disclosure.

The various embodiments of the gate drive system 14 herein are merely exemplary. Any number of different systems can be used to carry out the principles described herein. FIG. 7 is a flow diagram illustrating a method for providing overcurrent protection for a power transistor according to one embodiment of the present disclosure. First, a control signal is provided between a control node and a Kelvin connection node of a power transistor (step 100). As discussed above, a resistance between a first power switching node and a second power switching node of the power transistor is based on the control signal. Next, the Kelvin connection node is coupled to the second power switching node after the control signal is provided such that the power transistor is switched from a blocking mode of operation to a conduction mode of operation (step 102). Before providing the control signal such that the power transistor is switched from the conduction mode of operation to the blocking mode of operation, the Kelvin connection node is isolated from the second power switching node (step 104). As discussed above, coupling the Kelvin connection node to the second power switching node introduces feedback between the control loop and the power loop that partially turns off the power transistor in the event of an overcurrent event and thus increases a short circuit withstand time of the power transistor. Isolating the Kelvin connection node from the second power switching node before switching the power transistor from the conduction mode of operation to the blocking mode of operation maintains the switching speed of the power transistor. Further as discussed above, the power transistor may be a MOSFET, an IGBT, or any other suitable power transistor. The conduction mode of operation may include a first quadrant mode of operation or a third quadrant mode of operation. In some embodiments, the conduction mode may include a second quadrant mode of operation or a fourth quadrant mode of operation. In one embodiment, the Kelvin connection node is coupled to the second power switching node at least 5 picoseconds after the control signal is provided such that the power transistor is switched from the blocking mode to the conduction mode. Generally, the Kelvin connection node may be coupled to the second power switching node anywhere between 5 picoseconds and 500 microseconds after the control signal is provided such that the power transistor is switched from the blocking mode to the conduction mode. Notably, these timing values are merely exemplary. In one embodiment, the Kelvin connection node is isolated from the second power switching node at least 5 picoseconds before the control signal is provided such that the power transistor is switched from the conduction mode to the blocking mode. Generally, the Kelvin connection node may be isolated from the second power switching node anywhere between 5 picoseconds and 500 microseconds before the control signal is provided such that the power transistor is switched from the conduction mode to the blocking mode. As stated above, these timing values are merely exemplary.

Figure 8:
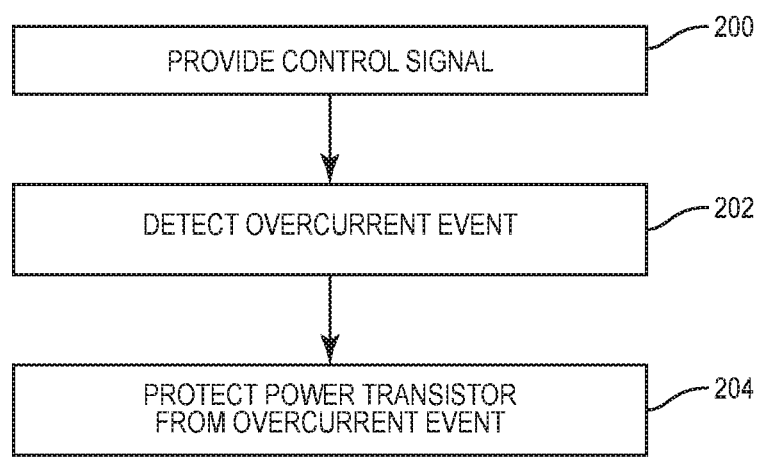
FIG. 8 is a flow diagram illustrating a method for detecting an overcurrent event in a power transistor according to one embodiment of the present disclosure.

FIG. 8 is a flow diagram illustrating a method for measuring an overcurrent event according to one embodiment of the present disclosure. First, a control signal is provided between a control node and a Kelvin node of a power transistor, wherein a resistance between a first power switching node and a second power switching node of the power transistor is based on the control signal (step 200). An overcurrent event is detected based on a signal measured at the Kelvin connection node of the power transistor (step 202). In other words, an overcurrent event is detected based on a signal measured in the control loop of the power transistor, or in a parallel current path to the power loop that provides a current that is proportional to the power loop. In response to detection of the overcurrent event, the power transistor is protected from the overcurrent event (step 204). As discussed above, the overcurrent event may be detected by measuring a voltage across a sense resistor coupled to the Kelvin connection node. The power transistor may be protected from the overcurrent event by partially or fully turning off the power transistor when the power transistor is operating in the first quadrant mode of operation or by partially or fully turning on the power transistor when the power transistor is operating in a third quadrant mode of operation. Further, any devices coupled in parallel with the power transistor (e.g., freewheeling diodes, etc.) will also be protected from overcurrent events.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    providing a control signal between a control node and a Kelvin connection node of a power transistor, wherein a resistance between a first power switching node and a second power switching node of the power transistor is based on the control signal;
    after providing the control signal such that the power transistor is switched from a blocking mode of operation to a conduction mode of operation, coupling the Kelvin connection node to the second power switching node; and
    before providing the control signal such that the power transistor is switched from the conduction mode of operation to the blocking mode of operation, isolating the Kelvin connection node from the second power switching node.

2. The method of claim 1 wherein the power transistor is a metal-oxide-semiconductor field-effect transistor (MOSFET) comprising a semiconductor structure between the control node, the Kelvin connection node, the first power switching node, and the second power switching node such that the control node is coupled to a gate region of the semiconductor structure, the first power switching node is coupled to a drain region of the semiconductor structure, and the second power switching node and the Kelvin connection node are coupled to a source region of the semiconductor structure.

3. The method of claim 1 wherein the power transistor is an insulated gate bipolar transistor (IGBT) comprising a semiconductor structure between the control node, the Kelvin connection node, the first power switching node, and the second power switching node such that the control node is coupled to a gate region of the semiconductor structure, the first power switching node is coupled to a collector region of the semiconductor structure, and the second power switching node and the Kelvin connection node are coupled to an emitter region of the semiconductor structure.

4. The method of claim 1 wherein the conduction mode of operation is one of a first quadrant mode of operation and a third quadrant mode of operation.

5. Support circuitry for a power transistor, the power transistor comprising a control node, a Kelvin connection node, a first power switching node, a second power switching node, and a semiconductor structure between the control node, the Kelvin connection node, the first power switching node, and the second power switching node such that a resistance between the first power switching node and the second power switching node is based on a control signal provided between the control node and the Kelvin connection node, the support circuitry comprising:
  a feedback switching element coupled between the Kelvin connection node and the second power switching node; and
  switching control circuitry coupled to the feedback switching element, the switching control circuitry configured to:
    cause the feedback switching element to couple the Kelvin connection node to the second power switching node after the power transistor is switched from a blocking mode of operation to a conduction mode of operation; and
    cause the feedback switching element to isolate the Kelvin connection node from the second power switching node before the power transistor is switched from the conduction mode of operation to the blocking mode of operation.

6. The support circuitry of claim 5 wherein the power transistor is a metal-oxide-semiconductor field-effect transistor (MOSFET) comprising the semiconductor structure between the control node, the Kelvin connection node, the first power switching node, and the second power switching node such that the control node is coupled to a gate region of the semiconductor structure, the first power switching node is coupled to a drain region of the semiconductor structure, and the second power switching node and the Kelvin connection node are coupled to a source region of the semiconductor structure.

7. The support circuitry of claim 6 further comprising the power transistor.

8. The support circuitry of claim 5 wherein the power transistor is an insulated gate bipolar transistor (IGBT) comprising the semiconductor structure between the control node, the Kelvin connection node, the first power switching node, and the second power switching node such that the control node is coupled to a gate region of the semiconductor structure, the first power switching node is coupled to a collector region of the semiconductor structure, and the second power switching node and the Kelvin connection node are coupled to an emitter region of the semiconductor structure.

9. The support circuitry of claim 8 further comprising the power transistor.

10. The support circuitry of claim 5 wherein the conduction mode of operation is one of a first quadrant mode of operation and a third quadrant mode of operation.

11. The support circuitry of claim 5 further comprising a sense resistor coupled between the Kelvin connection node of the power transistor and an intermediate node, wherein the feedback switching element is coupled between the intermediate node and the second power switching node.

12. The support circuitry of claim 11 further comprising sense circuitry configured to detect an overcurrent event based on a voltage across the sense resistor.

13. The support circuitry of claim 11 further comprising an additional sense resistor coupled between the intermediate node and a control return node, wherein the control signal is provided between the control node and the control return node.

14. The support circuitry of claim 13 further comprising sense circuitry configured to detect an overcurrent event based on a voltage across the sense resistor and the additional sense resistor.

15. The support circuitry of claim 11 further comprising a sense switching element coupled between the intermediate node and a control return node, wherein:
  the control signal is provided between the control node and the control return node; and
  the switching control circuitry is further configured to operate the sense switching element in a complementary fashion to the feedback switching element.

16. The support circuitry of claim 15 further comprising sense circuitry configured to detect an overcurrent event based on a voltage across the sense resistor.

17. The support circuitry of claim 12 further comprising:
  a first overcurrent protection switching element coupled between the control node and an additional intermediate node;
  an overcurrent protection diode comprising an anode coupled to the intermediate node and the additional intermediate node; and
  a second overcurrent protection switching element coupled between a predetermined voltage and the control node, wherein the switching control circuitry is further configured to cause the first overcurrent protection switching element to couple the control node to the additional intermediate node and cause the second overcurrent protection switching element to isolate the control node from the predetermined voltage in response to detection of an overcurrent event.

18. The support circuitry of claim 17 wherein the switching control circuitry is further configured to cause the first overcurrent protection switching element to isolate the control node from the additional intermediate node and cause the second overcurrent protection switching element to couple the control node to the predetermined voltage, wherein the predetermined voltage is sufficient to cause a channel of the power transistor to conduct current such that a current from the second power switching node to the first power switching node flows through the channel of the power transistor when the power transistor is operating in a third quadrant mode of operation.

19. A method comprising:
  providing a control signal between a control node and a Kelvin connection node of a power transistor, wherein a resistance between a first power switching node and a second power switching node of the power transistor is based on the control signal wherein the Kelvin connection node is not coupled to the second power switching node during switching of the power transistor;
  detecting an overcurrent event based on a signal measured at the Kelvin connection node of the power transistor; and
  in response to detection of an overcurrent event, protecting the power transistor from the overcurrent event.

20. The method of claim 19 wherein the power transistor is a metal-oxide-semiconductor field-effect transistor (MOSFET) comprising a semiconductor structure between the control node, the Kelvin connection node, the first power switching node, and the second power switching node such that the control node is coupled to a gate region of the semiconductor structure, the first power switching node is coupled to a drain region of the semiconductor structure, and the second power switching node and the Kelvin connection node are coupled to a source region of the semiconductor structure.

21. The method of claim 19 wherein the power transistor is an insulated gate bipolar transistor (IGBT) comprising a semiconductor structure between the control node, the Kelvin connection node, the first power switching node, and the second power switching node such that the control node is coupled to a gate region of the semiconductor structure, the first power switching node is coupled to a collector region of the semiconductor structure, and the second power switching node and the Kelvin connection node are coupled to an emitter region of the semiconductor structure.

22. The method of claim 19 wherein protecting the power transistor from the overcurrent event comprises reducing a voltage of the control signal.

* * * * *